United States Patent
Shan et al.

(10) Patent No.: US 7,808,538 B2
(45) Date of Patent: Oct. 5, 2010

(54) IMAGE SENSORS WITH BLOOMING REDUCTION MECHANISMS

(75) Inventors: Jizhang Shan, Cupertino, CA (US); Xinping James He, San Jose, CA (US); Henry Yang, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 828 days.

(21) Appl. No.: 11/656,587

(22) Filed: Jan. 22, 2007

(65) Prior Publication Data

US 2008/0174685 A1    Jul. 24, 2008

(51) Int. Cl.
*H04N 3/14* (2006.01)
*H04N 5/335* (2006.01)

(52) U.S. Cl. .................. 348/308; 348/294; 348/297; 348/314

(58) Field of Classification Search .......... 348/294–324
See application file for complete search history.

(56) References Cited

U.S. PATENT DOCUMENTS

| | | | |
|---|---|---|---|
| 5,646,390 A * | 7/1997 | Wang et al. | 235/454 |
| 2007/0285526 A1* | 12/2007 | Mann et al. | 348/222.1 |
| 2008/0055440 A1* | 3/2008 | Pertsel et al. | 348/297 |
| 2008/0143841 A1* | 6/2008 | Tico et al. | 348/208.99 |

* cited by examiner

*Primary Examiner*—Jason Chan
*Assistant Examiner*—Pritham Prabhakher
(74) *Attorney, Agent, or Firm*—Blakely Sokoloff Taylor & Zafman, LLP

(57) ABSTRACT

A CMOS image sensor having blooming reduction mechanisms is disclosed. The image sensor can include a plurality of pixels arranged in rows and a timing and control circuit in electrical communication with the plurality of pixels. The timing and control circuit includes a readout module configured for outputting a first row of pixels exposed for a first exposure period, outputting a second row of pixels exposed for the first exposure period after outputting the first row of pixels, and thereafter outputting a third row of pixels exposed for a second exposure period different than the first exposure period, the third row of pixels being between the first and second rows of pixels.

24 Claims, 7 Drawing Sheets

IMAGE SENSORS WITH BLOOMING REDUCTION MECHANISMS

TECHNICAL FIELD

The present disclosure relates to image sensors having blooming reduction mechanisms. In particular, aspects of the present disclosure relate to complementary metal oxide silicon (CMOS) image sensors having increased dynamic range and reduced blooming characteristics.

BACKGROUND

Unlike traditional cameras that use films to capture and store images, today's digital cameras use solid-state image sensors to acquire images. Such image sensors are typically disposed on fingernail-sized silicon chips containing millions of photoelectric devices such as photodiodes arranged in an array of pixels. During exposure, each photoelectric device records intensity or brightness of an incident light by converting optical energy into accumulated electrical charges. The brightness recorded by each photoelectric device can then be read out and stored as digital signals.

One problem associated with solid-state image sensors is their limited dynamic range. Dynamic range is the ratio of maximum and minimum light intensities that an image sensor can capture. The charge holding capacity of each photoelectric device in the image sensor typically determines its dynamic range. Thus, the limited capacity of each photoelectric device limits the image sensor's ability to capture bright and dark subjects at the same time. As a result, if a long exposure is used to capture dark subjects, bright subjects can lose contrast and become a bright spot. If a short exposure is used to capture bright subjects, dark subjects can blend into a dark background and simply disappear.

Another problem associated with solid-state image sensors is blooming. Blooming occurs when a photoelectric device of the image sensor overflows and spills accumulated charges (e.g., electrons) into neighboring photoelectric devices. The spilled charges can distort the brightness recorded by the neighboring photoelectric devices and ultimately reduce spatial resolution. For example, the brightness recorded by a neighboring photoelectric device can be falsely high due to the spilled charges. As a result, the bright subjects causing blooming often appear to have a "glow" around them in a captured image.

DETAILED DESCRIPTION

The present disclosure describes image sensors with blooming reduction mechanisms. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIGS. 1-6.

Figure 1:
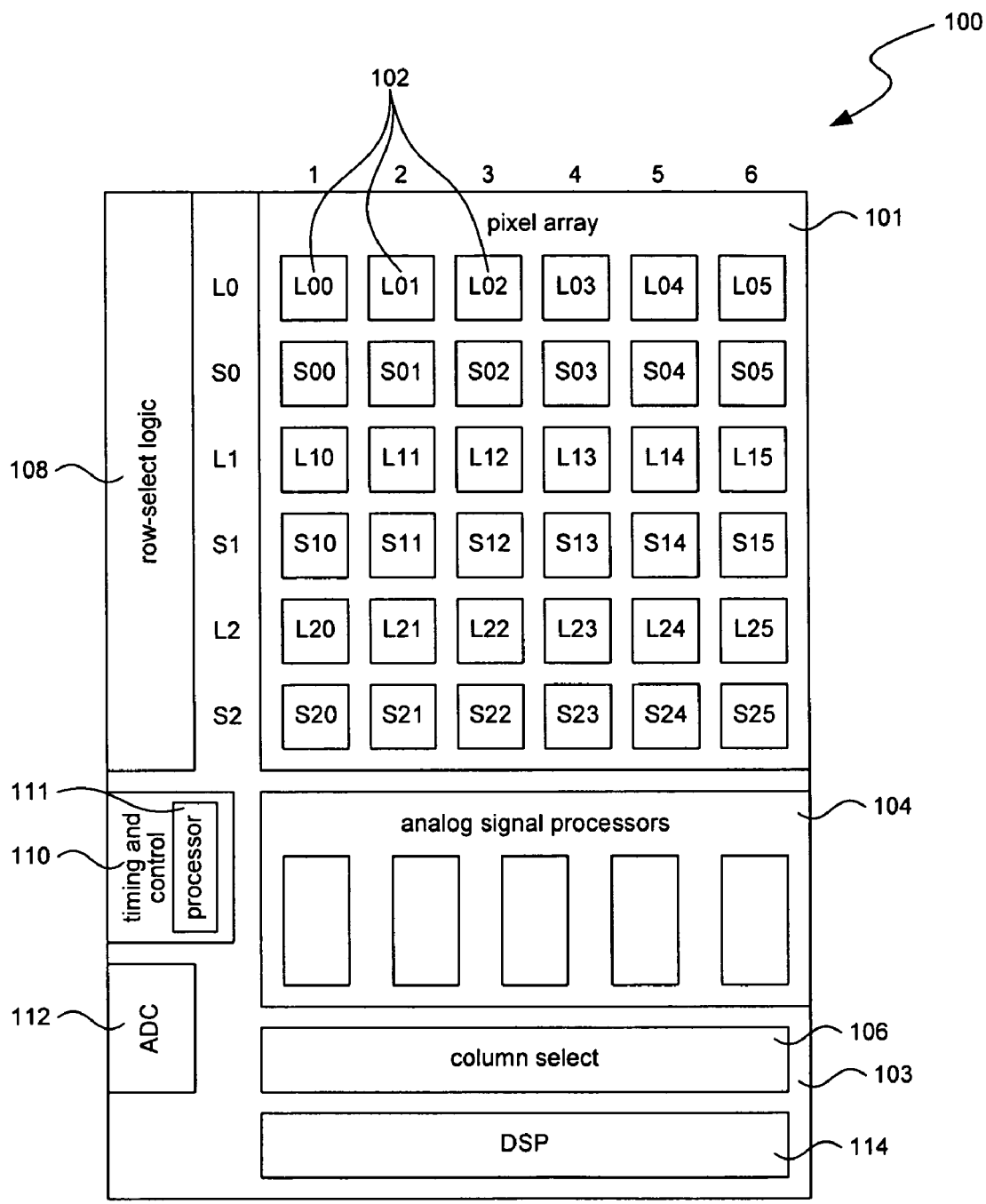
FIG. 1 is a schematic diagram of an image sensor configured in accordance with an embodiment of the invention.

FIG. 1 schematically illustrates an image sensor 100 with a blooming reduction mechanism and configured in accordance with an embodiment of the invention. The image sensor 100 can include a pixel array 101, a column-select circuit 106, a row-select circuit 108, analog signal processors 104, a timing and control circuit 110, an A/D converter 112, and a digital signal processor (DSP) 114. These components can be disposed on a single substrate 103 (e.g., a semiconductor chip) or can be disposed on multiple substrates.

The pixel array 101 can include a plurality of pixels 102 arranged in columns and rows. In the illustrated embodiment, the pixel array 101 includes six columns and six rows designated rows L0, S0, L1, S1, L2, and S2 and columns 1 to 6. For example, row L0 includes pixels L00-L05, and row S0 includes pixels S00-S05. The pixels in rows L0, L1, and L2 are configured for a long exposure period (e.g., 2 seconds), and those in rows S0, S1, and S2 are configured for a short exposure period (e.g., 0.1 seconds). Thus, rows L0, L1, and L2 are referred to as long exposure rows, and rows S0, S1, and S2 are referred to as short exposure rows hereinafter. Individual pixels 102 can be configured as a charged coupled device, a CMOS passive pixel sensor, a CMOS active pixel sensor, or other types of light sensors. For example, the pixels 102 can be configured as 4T CMOS active pixels as described in more detail below with reference to FIG. 2. In one embodiment, the pixels 102 in the long exposure rows are configured to be generally identical to those in the short exposure rows. In other embodiments, the pixels 102 in the long exposure rows can be configured to be different than those in the short exposure rows. For example, the pixels 102 in rows L0, L1, and L2 can include photosites having a larger well capacity than those in rows S0, S1, and S2.

The timing and control circuit 110 can include a microprocessor-based processor 111 containing logic modules for monitoring and controlling the exposure and readout sequence of the pixels 102. The processor 111 can include an 8080, 8085, 8086, or other type of logic processor produced by Intel, Corp. of Santa Clara, Calif. The timing and control circuit 110 can also include logic modules configured to reduce overexposure blooming by varying the exposure and readout sequence of the pixels 102, as described in more detail below with reference to FIG. 2.

The column-select circuit 106 and the row-select circuit 108 can include solid-state switches including, for example, metal oxide silicon (MOS), CMOS, or other types of solid-state switch. In operation, the column-select circuit 106 and the row-select circuit 108 can decode signals sampled from the pixels 102 by selectively enabling output from each column and row of the pixels 102.

The analog signal processors 104 and/or the digital signal processor 114 can include input clamping, sampling, amplifying, multiplexing, filtering, or other types of circuits. For example, the analog signal processors 104 can include source-follower transistors for amplifying sampled signals from the pixels 102, and the digital signal processor 114 can include a data compression circuit. The A/D converter 112 can include conversion circuits that convert analog signals from the pixels 102 into digital signals having a desired resolution (e.g., 8-bit, 16-bit, 32-bit, etc.)

In operation, the timing and control circuit 110 controls exposure of individual rows of the pixel array 101 to an incident light by selectively turning on/off the row-select circuit 108 and the column-select circuit 106. The individual rows of the pixel array 101 can be exposed for different exposure periods. For example, rows L0, L1, and L2 are exposed for a long exposure period (e.g., 2 seconds), and rows S0, S1, and S2 are exposed for a short exposure period (e.g., 0.1 seconds). During exposure, the pixels 102 convert the incident light into accumulated charges (e.g., electrons). Then the pixels 102 are sampled to generate analog output signals based on the amount of accumulated charges. The analog signal processors 104 then process the analog output signals before the A/D converter 112 converts them into digital output signals. The digital signal processor 114 then further processes the digital output signals into final output signals that can be displayed on a monitor or printed as a photo.

One expected advantage of having different exposure periods for different rows of pixels 102 is the improved dynamic range of the image sensor 100. When a row of the pixels 102 has a long exposure period, dark subjects can be clearly captured. When another adjacent row of the pixels has a short exposure period, bright subjects can be captured. The captured dark and bright subjects can then be combined using histogram equalizing, weighted averaging, contrast blending, radiance mapping, or another suitable technique to derive a final image. The final image would have details for both the dark and bright subjects to improve the dynamic range of the image sensor 100.

Figure 2:
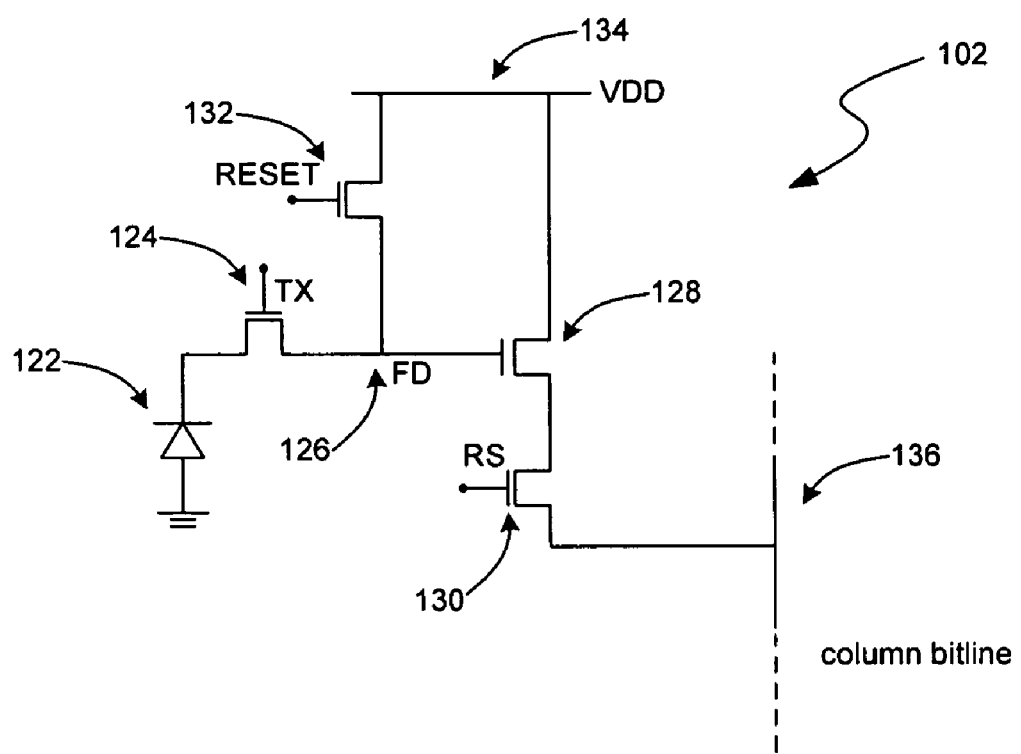
FIG. 2 is a schematic diagram of a pixel suitable for use in the image sensor of FIG. 1 and configured in accordance with the invention.

Individual components of the image sensor 100 are described below with reference to FIGS. 2-4. FIG. 2 illustrates a pixel 102 suitable for use in the image sensor 100 of FIG. 1. The pixel 102 includes a photodiode 122 connected to a floating node 126 via a transfer transistor 124. The floating node 126 in turn is connected to a source-follower transistor 128 that can buffer a signal from the floating node 126. The output from the source-follower transistor 128 is connected to a column bitline 136 via a row-select transistor 130. The floating node 126 is also electrically connected to a reset transistor 132 whose source is connected to a reference voltage line 134 at a reference voltage $V_{dd}$. In the illustrated embodiment, the pixel 102 is configured as a four-transistor (4T) CMOS active pixel. In other embodiments, the pixel 102 can be configured as a 3T, 5T, 6T, or 7T CMOS or as a CCD pixel.

In operation, during an integration period, the reset transistor 132 is first turned on to set the floating node 126 to the reference voltage $V_{dd}$. Then the transfer transistor 124 is turned on to transfer the accumulated charges from the photodiode 122 to the floating node 126. As a result, the floating node 126 acquires a new voltage, and the photodiode 122 is reset. The source-follower transistor 128 then buffers the new voltage at the floating node 126 onto the column bitline 136. In certain embodiments, before the photodiode 122 is exposed to an incident light, the transfer transistor 124 and the reset transistor 132 can be turned on to reset the photodiode 122.

Figure 3:
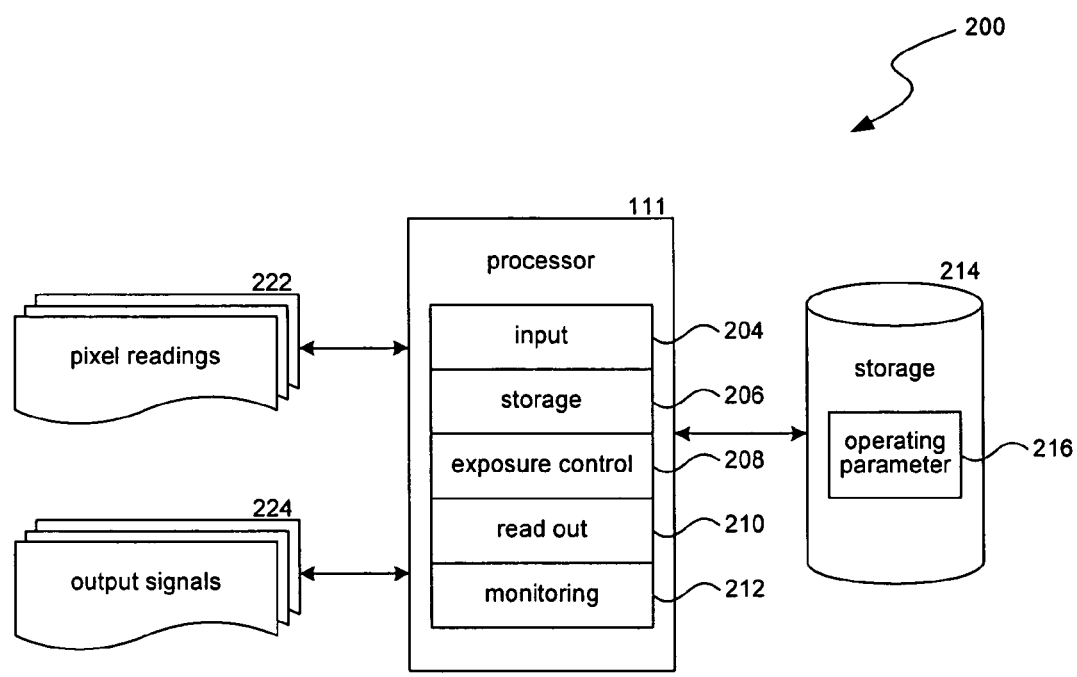
FIG. 3 is a functional diagram of logic modules of a timing and control circuit configured in accordance with an embodiment of the invention.

FIG. 3 illustrates a functional diagram showing logic modules 200 of the timing and control circuit 110 suitable for use in the image sensor 100. Each module can be a computer program, procedure, or process written as source code in a conventional programming language, such as the C++ programming language, and can be presented for execution by the processor 111 of the timing and control circuit 110. Each module can also be implemented as individual electrical circuits. The various implementations of the source code and object and byte codes can be stored on a computer-readable storage medium or embodied on a transmission medium in a carrier wave.

The modules of the timing and control circuit 110 can include an input module 204, a storage module 206, an exposure control module 208, a readout module 210, and a monitoring module 212. The input module 204 accepts input, such as pixel readings 222 (e.g., pixel output voltage), and communicates the accepted information to other components for further processing. The storage module 206 organizes records including, for example, operating parameters 216, and facilitates storing and retrieving of these records to and from a storage 214 (e.g., a flash memory module, an EPROM, or other storage device). Any type of record organization can be utilized, including a flat file system, hierarchical database, relational database, or distributed database.

The exposure control module 208 can control an exposure sequence of the pixels 102 by, for example, causing each row of pixels 102 to be exposed to an incident light sequentially. For instance, the exposure control module 208 can cause row L0 to be exposed before row S0 is exposed, or can cause row L0 and S0 to be exposed at the same time. In one embodiment, the exposure control module 208 can also implement asynchronous sequential exposure of the long exposure rows and the short exposure rows. For example, the long exposure rows can be exposed sequentially starting from a time $T_0$. After a preset time period $\Delta T$, the short exposure rows are exposed sequentially. In other embodiments, the exposure control module 208 can implement synchronous sequential exposure of the long and short exposure rows. For example, the short exposure rows can be exposed only after all the long exposure rows have been exposed.

The readout module 210 can control a readout sequence of the pixels 102 by, for example, sending output signals 224 to the column-select and row-select circuits 106, 108. In one embodiment, the readout module 210 can be configured to scan each row of the pixel array 101 sequentially. For example, the readout module 210 can cause the rows to be scanned in a regular scanning sequence as follows:

L0, S0, L1, S1, L2, S2

In other embodiments, the readout module 210 can be configured to scan short exposure rows preferentially before scanning long exposure rows to reduce scanning/exposure time. In yet further embodiments, the readout module 210 can be configured to repeatedly scan a particular row in a single scanning sequence, as described in more detail below with reference to FIG. 6.

The monitoring module 212 can generate control variables based on the pixel readings 222. For example, the monitoring module 212 can compare the pixel readings 222 (e.g., sensed light intensity) of the pixels 102 (FIG. 1) to a preset threshold value to determine whether the pixels 102 are overexposed. If the sensed light intensity exceeds the preset threshold value, the monitoring module 212 indicates overexposure, and the readout and/or exposure control modules 210, 208 can modify the readout and/or exposure sequence to reduce the blooming effect. For example, if the monitoring module 212 indicates that there is no overexposure, then the regular scanning sequence can be used; otherwise, an overexposure readout sequence can be used, as described in more detail below with reference to FIG. 4.

Figure 4:
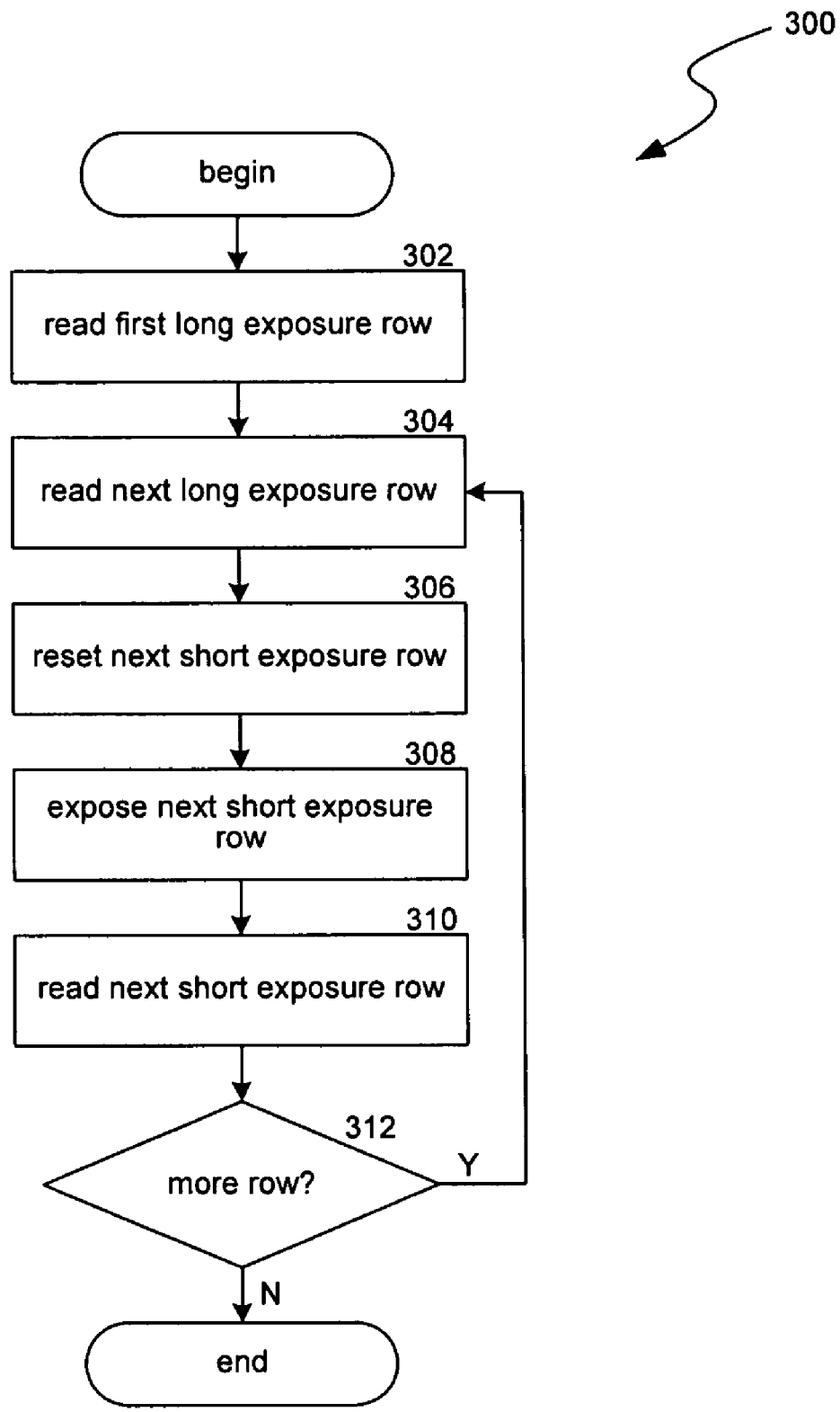
FIG. 4 is a flow diagram showing a method for operating an image sensor configured in accordance with an embodiment of the invention.

FIG. 4 illustrates a flow diagram showing a method 300 for operating the image sensor 100 of FIG. 1 for blooming reduction. As an initial step, the first long exposure row L0 can be read out after row L0 has been exposed for a first exposure period (block 302). As described above with reference to FIG. 2, reading the pixels 102 of row L0 can include turning on the transfer transistor 124 to transfer accumulated charges from the photodiode 122 to the floating node 126. As a result, the photodiode 122 is now reset (i.e., having a voltage generally equal to a reference voltage). Then the successive long exposure row (i.e., row L1) can be read out after row L1 has been exposed for the first exposure period (block 304). Row L1 can be exposed generally simultaneously as the row L0 or can be exposed after row L0 has been read out. After reading out row L1, the photodiode 122 of each pixel 102 in row L1 is also reset.

After both the first and second long exposure rows L0, L1 are read, the first successive short exposure row (i.e., row S0) can be reset (block 306). Then the first successive short exposure row (i.e., row S0) can be exposed for a second exposure period less than the first exposure period (block 308). After the second exposure period expires, the pixels 102 in row S0 can be read out (block 310). At decision block 312, if there are more rows in the pixel array 101, then the process returns to block 304, and the remaining rows of pixels can be scanned in a scanning sequence as follows:

L0, L1, S0, L2, S1, L3, S2

Otherwise, the process ends.

One expected advantage of operating the image sensor 100 according to the process of FIG. 4 is the reduced blooming potential of the pixels 102. In the illustrated embodiment, rows L0 and L1 are long exposure rows, so the pixels 102 in these rows have a greater potential for blooming than those in short exposure rows S0, S1, and S2. Blooming of any pixel 102 in rows L0 and L1 can affect the short exposure row S0 because row S0 is adjacent to both row L0 and row L1. By reading out the pixels 102 in rows L0 and L1 before resetting and subsequently exposing the short exposure row S0, any spilled-over charges can be destroyed. Thus, the impact of any blooming in the long exposure rows L0 and L1 can be at least reduced. As a result, the dynamic range of the image sensor 100 can be increased. Another expected advantage of several embodiments of the illustrated process of FIG. 4 is that the image quality produced by the image sensor 100 is not affected during normal dynamic range operations.

Figure 5:
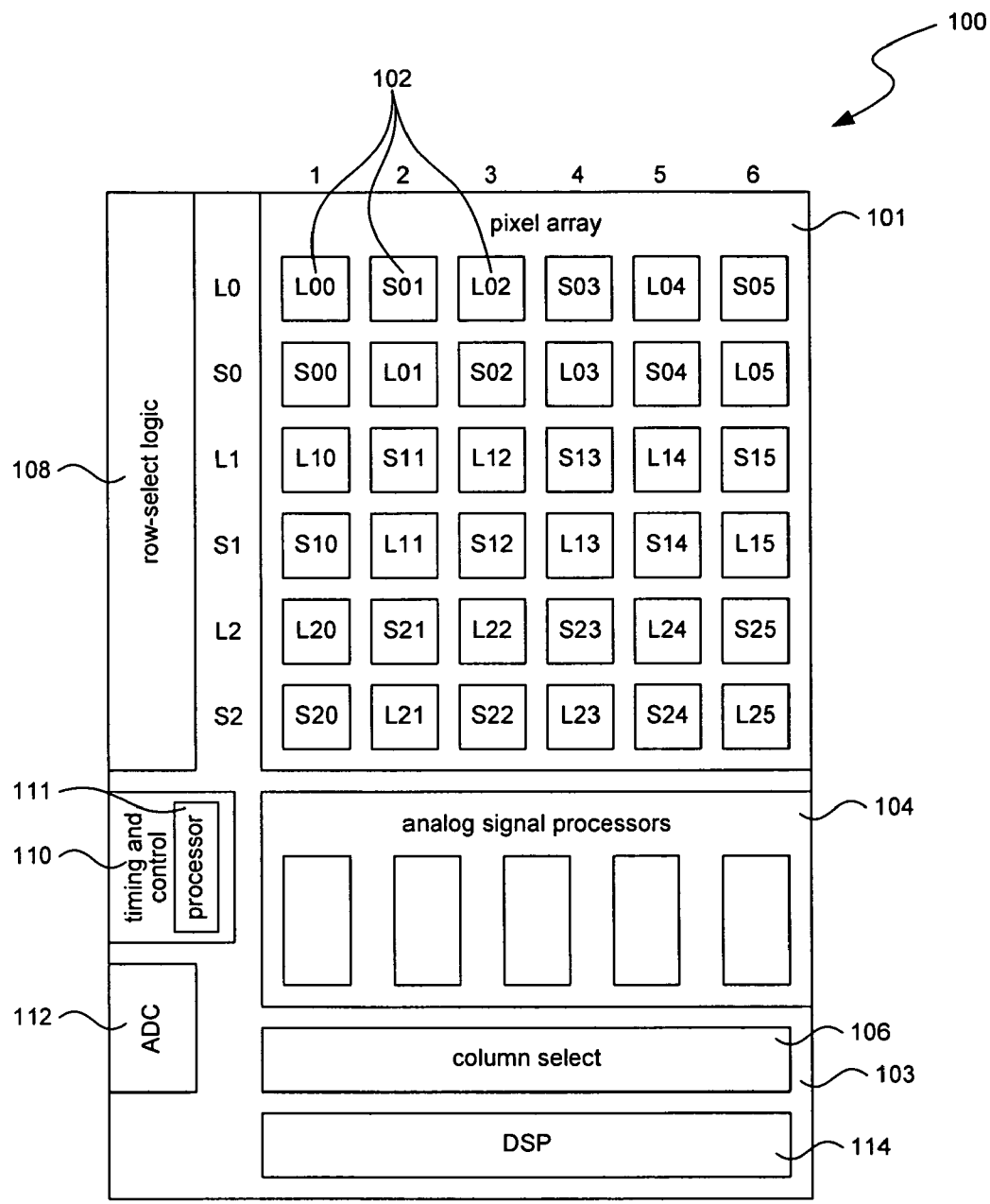
FIG. 5 is a schematic diagram of an image sensor configured in accordance with another embodiment of the invention.

Even though the image sensor 100 in FIG. 1 is illustrated as having pixels arranged in long and short exposure rows, in another embodiment, the image sensor 100 can include pixel subsets that have pixels located in different rows and/or columns as illustrated in FIG. 5. In the illustrated embodiment, the image sensor 100 includes long exposure subsets L0, L1, and L2 and short exposure subsets S0, S1, and S2. Each subset can include pixels located in different rows and/or columns. For example, subset L0 can include pixels L00 in the first row/first column and pixels L01 in the second row/second column. One expected advantage of having pixels in different rows and/or columns is that the impact of blooming in long exposure subsets L0, L1, and L2 to adjacent short exposure subsets can be at least reduced both column-wise and row-wise.

Figure 6:
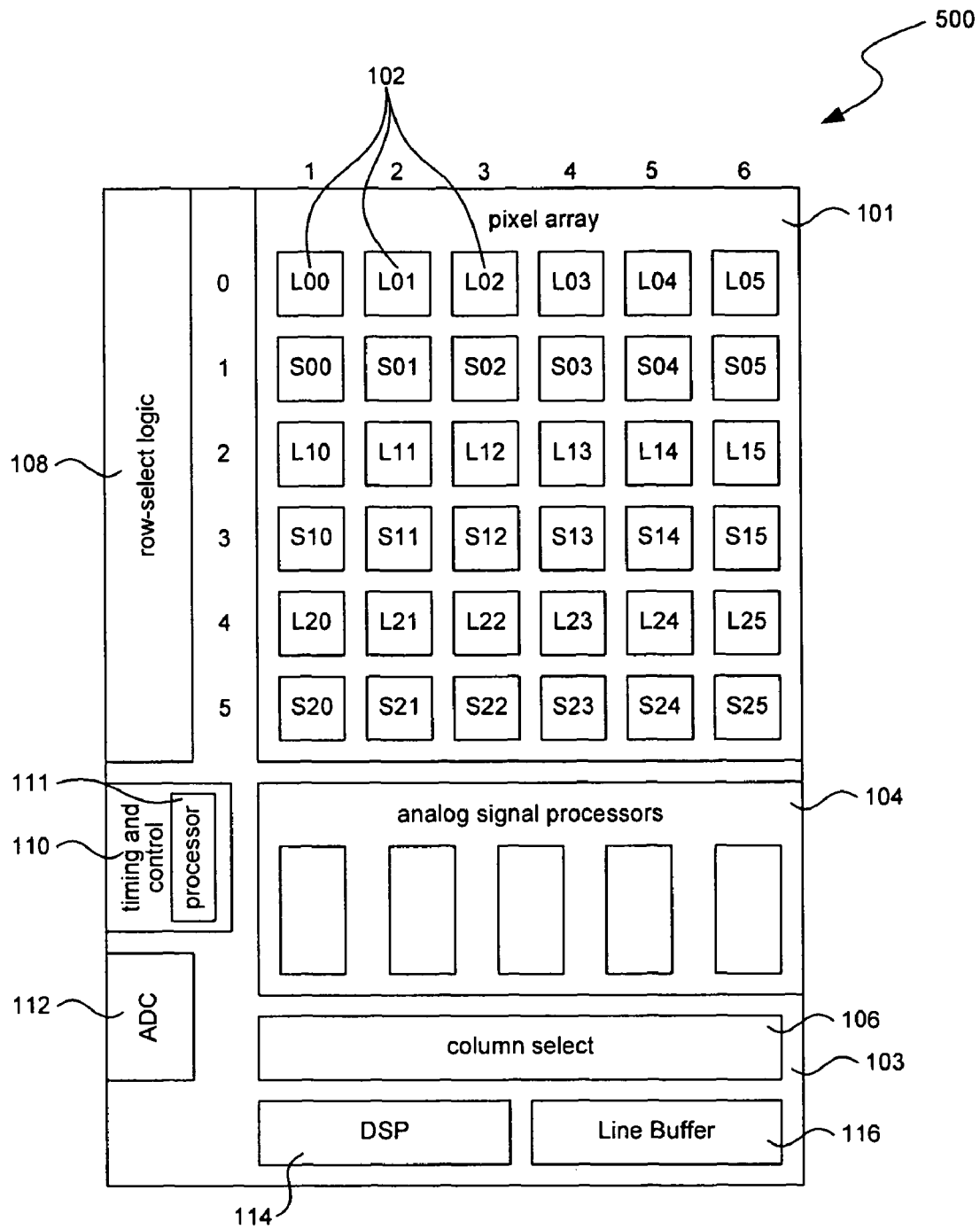
FIG. 6 is a schematic diagram of an image sensor configured in accordance with a further embodiment of the invention

FIG. 6 schematically illustrates an image sensor 500 with a blooming reduction mechanism and configured in accordance with another embodiment of the invention. In this embodiment, several components of the image sensor 500 are similar to those of the image sensor 100 described above with reference to FIG. 1. As such, like reference symbols refer to like features and components in FIGS. 1-5. The image sensor 500 can further include a line buffer 116 configured for temporarily holding pixel output from the pixel array 101. The line buffer 116 can be analog or digital. For example, the line buffer 116 can include analog registers having capacitors for storing pixel output, or other suitable buffering components.

The pixel array 101 of the image sensor 500 is arranged as rows 0-5 and columns 1-6. In the illustrated embodiment, individual pixels 102 of the pixel array 101 are all configured to be generally identical. For example, individual pixels 102 can be configured as 4T CMOS active pixels as described above with referenced to FIG. 2 or as other types of CMOS or CCD pixels.

Figure 7:
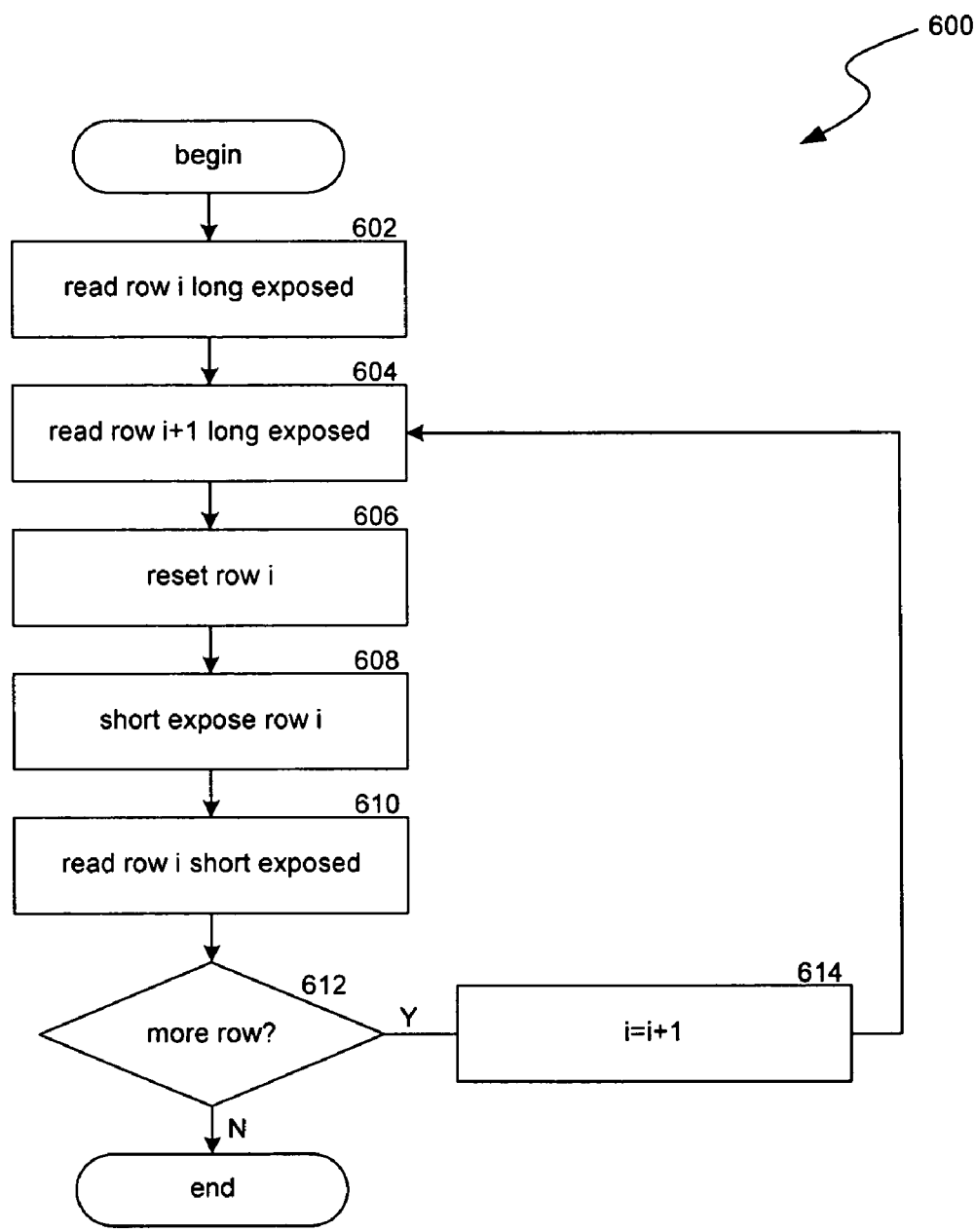
FIG. 7 is a flow diagram showing a method for operating the image sensor of FIG. 5.

FIG. 7 illustrates a flow diagram showing a method 600 that can be implemented in the timing and control circuit 110 for operating the image sensor 500 of FIG. 6. As an initial step, the readout module 210 can cause row i (i is a positive integer, e.g., row 0) to be read after row i has been exposed for a first exposure period (block 602). The first exposure period can be configured to capture details of dark subjects of an image. Then row i+1 (e.g., row 1) is read after this row has been exposed for a first exposure period (block 604). The readout signals from row i and row i+1 can be buffered in the line buffer 116 (FIG. 5).

After row i+1 is read, row i is reset again to clear any spilled charges from row i+1 during the exposure for the first exposure period (block 606). Then row i is exposed again for a second exposure period (block 608). The second exposure period can be configured to capture details of bright subjects of the image. Then row i is read out again after the second exposure period expires (block 610). At decision block 612, if there are more rows in the pixel array 101, then the process returns to block 604 with i incremented by 1 (block 614); otherwise, the process ends.

One expected advantage of operating the image sensor 500 according to the process illustrated in FIG. 7 is the reduced blooming potential of the pixels 102. As described above, the method 600 includes reading out the pixels 102 in rows i+1 before resetting and exposing the previous row i. As a result, when row i is exposed for the second exposure period to capture bright subjects, any spilled charges from row i+1 have been destroyed to at least reduce the blooming effect from row i+1. Another expected advantage is the increased dynamic range of the image sensor 500 because each row of the pixel array 101 is exposed twice to capture both dark and bright subjects of an image.

From the foregoing, it will be appreciated that specific embodiments of the invention have been described herein for purposes of illustration, but that various modifications may be made without deviating from the invention. Certain aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

We claim:

1. A CMOS image sensor, comprising:
a plurality of pixels arranged in rows;
a timing and control circuit in electrical communication with the plurality of pixels, wherein the timing and control circuit includes:

a monitoring module for determining whether at least one of a first and a second row of pixels are overexposed;
an exposure control module configured for exposing a third row of pixels after reading out the first and second rows of pixels, wherein the exposure control module is configured for exposing the third row of pixels in response to determining that the at least one of the first and second rows are overexposed, the third row of pixels being disposed between the first and second rows of pixels; and
a readout module configured for:
outputting the first row of pixels exposed for a first exposure period;
outputting the second row of pixels exposed for the first exposure period after outputting the first row of pixels; and
thereafter, outputting the third row of pixels exposed for a second exposure period different than the first exposure period.

2. The CMOS image sensor of claim 1 wherein the second exposure period is less than the first exposure period.

3. The CMOS image sensor of claim 1 wherein the readout module is also configured for
(a) thereafter, outputting another successive row of pixels exposed for the first exposure period;
(b) thereafter, outputting another successive row of pixels exposed for the second exposure period; and
repeating steps (a)-(b) until all rows of pixels are outputted.

4. The CMOS image sensor of claim 1 wherein the readout module is configured for reading out the first row of pixels after exposing the first row of pixels but before exposing the second row of pixels.

5. The CMOS image sensor of claim 1 wherein the exposure control module for exposing exposes the first, second, and third rows of pixels successively.

6. The CMOS image sensor of claim 1, wherein the monitoring module is configured for monitoring signal output from the first and second rows of pixels, comparing the signal output to a preset threshold value, and indicating overexposure if the signal output exceeds the preset threshold value.

7. An image recording device incorporating the CMOS image sensor of claim 1, wherein the image recording device includes at least one of a still camera, a camcorder, a cellular phone, a video recorder, and a personal data assistant.

8. A timing and control circuit for image sensors having a plurality of pixels arranged in rows, comprising:
an exposure control module for exposing first and second rows of pixels for a first exposure period and exposing a third row of pixels for a second exposure period shorter than the first exposure period, wherein the third row of pixels is disposed between the first and second rows;
a monitoring module for determining whether at least one of the first and the second rows of pixels are overexposed, and if at least one of the first and second rows are overexposed, the exposure control module is configured for exposing the third row of pixels after reading out the first and second rows of pixels, the exposure of the third row of pixels responsive to whether the at least one of the first and second rows of pixels are overexposed; and
a readout module configured for successively outputting the first and second rows of pixels exposed for the first exposure period and thereafter outputting the third row of pixels exposed for the second exposure period.

9. The timing and control circuit of claim 8 wherein the readout module is also configured for (a) outputting another successive row of pixels exposed for the first exposure period after outputting the third row of pixels;
(b) thereafter, outputting another successive row of pixels exposed for the second exposure period; and
repeating steps (a)-(b) until all rows of pixels are outputted.

10. A method for reducing blooming in an image sensor having a plurality of pixels arranged in rows, comprising:
exposing first and second rows of pixels for a first exposure period;
determining whether at least one of the first and second rows of pixels are overexposed;
exposing a third row of pixels, which is disposed between the first and second rows of pixels, for a second exposure period different than the first exposure period, the exposure of the third row of pixels responsive to whether the at least one of the first and second rows of pixels are overexposed; and
reading out the first row of pixels exposed for the first exposure period;
reading out the second row of pixels after reading out the first row of pixels; and
thereafter, reading out the third row of pixels exposed for the second exposure period.

11. The method of claim 10 wherein exposing the first and second rows of pixels includes exposing the first and second rows of pixels successively.

12. The method of claim 10 wherein exposing the first and second rows of pixels includes exposing the first and second rows of pixels generally simultaneously.

13. The method of claim 10 wherein the second exposure period is less than the first exposure period.

14. The method of claim 10 wherein reading out the first row of pixels includes sampling a voltage from individual pixels of the first row and resetting the pixels to a reference voltage.

15. The method of claim 10, further comprising:
(a) thereafter, reading out another successive row of pixels exposed for the first exposure period; and
(b) thereafter, reading out another successive row of pixels exposed for the second exposure period.

16. The method of claim 15, further comprising:
repeating steps (a)-(b) until all rows of pixels are read out.

17. The method of claim 10 wherein reading out the first row of pixels includes reading out the first row of pixels after exposing the first row of pixels but before exposing the second row of pixels.

18. The method of claim 10 wherein determining whether at least one of the first or second rows of pixels are overexposed includes monitoring signal output from the first and second rows of pixels and comparing the signal output to a preset threshold value.

19. A CMOS image sensor, comprising:
a plurality of pixels arranged in subsets;
a timing and control circuit in electrical communication with the plurality of pixels, wherein the timing and control circuit includes:
a monitoring module for determining whether at least one of a first and a second subset of pixels are overexposed;
an exposure control module for exposing a third subset of pixels after reading out the first and second subsets of pixels, wherein the exposure control module is configured for exposing a third subset of pixels responsive to the at least one of the first and second subsets being overexposed, each pair of pixels of the third subset of pixels being separated by a pixel of the first subset or the second subset; and a readout module configured for:
  outputting the first subset of pixels exposed for a first exposure period;
  outputting the second subset of pixels exposed for the first exposure period after outputting the first subset of pixels; and
  thereafter, outputting the third subset of pixels exposed for a second exposure period less than the first exposure period.

20. The CMOS image sensor of claim 19 wherein each subset includes pixels located in different rows and/or columns.

21. The CMOS image sensor of claim 19 wherein a pixel of the third subset is surrounded by pixels of the first and second subsets on all sides.

22. An image recording device incorporating the CMOS image sensor of claim 19, wherein the image recording device includes at least one of a still camera, a camcorder, a cellular phone, a video recorder, and a personal data assistant.

23. A method, comprising: exposing a first row of pixels of an image sensor for a first exposure period; exposing a second row of pixels of the image sensor for the first exposure period; monitoring signal output from the first and second rows of pixels; comparing the signal output to a preset threshold value; indicating overexposure if the signal output exceeds the preset threshold value; adjusting the second exposure period if the signal output indicates overexposure; reading the first and second row of pixels; resetting a third row of pixels to a reference voltage after reading the first and second row of pixels, the third row of pixels being disposed between the first and second rows of pixels; exposing the third row of pixels to a second exposure period after resetting the third row of pixels to the reference voltage; and reading the third row of pixels after exposing the third row of pixels to the second exposure period.

24. The method of claim 23, wherein the second exposure period is shorter than the first exposure period.

\* \* \* \* \*